United States Patent
Hornung

(10) Patent No.: US 7,053,614 B2
(45) Date of Patent: May 30, 2006

(54) OPTIMIZED CHANNEL CONTROLLER FOR NMR APPARATUS

(75) Inventor: Phillip A. Hornung, Union City, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 10/820,621

(22) Filed: Apr. 8, 2004

(65) Prior Publication Data

US 2005/0225325 A1    Oct. 13, 2005

(51) Int. Cl.
*G01V 3/00*    (2006.01)

(52) U.S. Cl. ...................... 324/312; 324/300

(58) Field of Classification Search ............... 324/312, 324/300, 322, 318
See application file for complete search history.

(56) References Cited

U.S. PATENT DOCUMENTS

| | | | |
|---|---|---|---|
| 4,191,919 A * | 3/1980 | Haney et al. | 324/312 |
| 4,375,676 A | 3/1983 | Berkowitz | |
| 4,525,673 A * | 6/1985 | Berkowitz | 324/312 |
| 4,888,553 A * | 12/1989 | Codrington | 324/312 |
| 5,349,296 A * | 9/1994 | Cikotte et al. | 324/309 |
| 5,581,183 A | 12/1996 | Lindstedt et al. | |
| 6,400,147 B1 * | 6/2002 | Toufaily et al. | 324/303 |
| 6,850,092 B1 * | 2/2005 | Chelcea et al. | 326/93 |

FOREIGN PATENT DOCUMENTS

EP    0 567 794 A2    11/1993

OTHER PUBLICATIONS

Article by Cosgrove, et al; entitled "A Computer-Controlled Pulse Sequencer for Pulsed NMR Experiments"; Published by J.Magn.Reson., vol. 38, 1980; pp. 207-214.

* cited by examiner

Primary Examiner—Louis Arana
(74) Attorney, Agent, or Firm—Bella Fishman; Edward H. Berkowitz

(57) ABSTRACT

A controller for apparatus assuming a sequence of precisely synchronized states in accordance with a lengthy event stream is realized in an architecture comprising a register layer comprising a plurality of latched registers for receiving event descriptors and parameters from a bus and a computational/logical layer for operations on/among certain of said parameters for presentation to external operational devices. An RF controller controlling frequency, pulse width, amplitude with precise timing for magnetic resonance applications is one example and a magnetic gradient controller controlling vector magnitude and orientation is another.

15 Claims, 8 Drawing Sheets

OPTIMIZED CHANNEL CONTROLLER FOR NMR APPARATUS

FIELD OF THE INVENTION

The invention is principally in the field of magnetic resonance apparatus and relates particularly to efficient control of time sensitive functions of such apparatus.

BACKGROUND OF THE INVENTION

Many instrument applications require the creation and maintenance of a precisely timed event stream. Frequency agile radar, arbitrary radio frequency (RF) generation, pulsed magnetic field sources, time domain instrumentation such as NMR spectrometers, MRI imagers and the like, are a few examples. Such apparatus may be described in an instantaneous sense as existing in a well define "state". The state in turn, is described by the quantitative condition of each of the independent variables of the apparatus. By way of a simple example, an RF synthesizer operating to produce a desired waveform from N frequency components may specify the frequency component(s), with corresponding values of amplitude, phase, state duration and perhaps a waveform repetition rate for 3N+2 variables to specify the state. The RF waveform may also be controllable as to shape, or time dependence with further computational burden. These parameters may repeat, repeat with changes in some parameters, repeat in a cyclic manner, etc., to produce the desired operation. A module that assembles the serial stream of states and provides the stream to the several sub-devices of the apparatus is referenced herein as a controller.

Another time sensitive function in an NMR device which is the subject of a controller operation is the management of magnetic gradients. In each of k spatial coordinates, a magnetic gradient is specified by $\partial B_z/\partial X^{(k)}$ (t), (that is, the time profile, or shape), the time for gating this quantity "on" and the duration. Again, a vector gradient pulse may be selectable in time dependence by ordering the instantaneous ordinate values, and the orientation of the resultant vector is determined from the vector sum of its components, each of which is the product of a corresponding controller.

Very early, the control function was implemented in a digital processor on an interrupt actuated basis where differing levels of priority were assigned to multiple tasks required for the operation of the apparatus. The processor, while executing some lower priority task, would receive an interrupt to activate a higher priority task, such as controlling the status of modules comprising the apparatus, e.g., an NMR instrument. In the case of an NMR instrument, RF excitation in the form of multiple RF pulses of diverse nature, magnetic field gradients, data acquisition, precise delays between various states and other operational parameters and logical values, all define the instantaneous state to be retrieved from memory for presentation to appropriate command buffer(s). The processor, in this generic prior art structure, might intersperse these higher priority functions with lower priority tasks as allowed by the interrupt structure. This presented a ponderous procedure with considerable complication in the software. Specific examples representative of such prior architecture are the NMR instruments manufactured by Varian under the name "Unity".

In further developing prior art, a controller processor, communicating with a separate host processor, offered greatly improved synchronous properties in sequencing the states of the apparatus. A host processor performs high level operations including description of the NMR pulse sequence in terms of parameter values defining the pulse sequence at consecutive time increments (as well as conducting post acquisition operations). The current operational information is placed by the host on a bus communicating with (output) controller processor(s) that operates to establish the sequence of physical states of RF power and magnetic field gradient. This division of resources separates the synchronous operations of the RF power source, transmit/receive switch and gradient power supplies from the time non-critical operations of the host.

The prior art controller shown in FIG. 2a derives fundamental instruction from a host computer 34, through a bus interface 92 to a controller memory 94. A state machine (stuffer) 96 assembles parameter values associated with selected controlled devices 101, 102, etc and the duration to associate with that macro-state of the apparatus defined by parameter values of all controllable devices contributing to the state of the apparatus. This triplet of data (device, parameter value, duration) is serially directed (stuffed) to the various controllable devices.

The prior art controller function of FIG. 2a presents device select, duration and parameter values to an output bus 100, common to the controllable devices that determine the state of the apparatus. Consequently, the rate at which the state of the system may be altered is distinctly limited because multiple parameter changes require a corresponding multiple device select instructions. Where the devices 101, 102, etc., retain their respective parameter values as previously set (that is, NRZ type devices), it follows that only changes to these values need be passed through the bus and ultimately, this type of controller may be regarded as a memory efficiency benchmark.

An advance in prior art controller apparatus is shown in FIG. 2b wherein the structure is similar to that of FIG. 2a with the exception that all controlled devices are addressed in parallel through independent control signals from the output of asynchronous-to-synchronous buffer 98. Buffer 98 is preferably a FIFO device wherein the (internal) clocking of the buffer content is derived from a field of a buffer word and this time datum determines the persistence time, or duration of the state. A device such as FIFO 98, or the equivalent provides for conversion of the asynchronous event stream to implementation of a synchronous sequence of physical states. The FIFO has a width (the FIFO word) sufficient to define the system state instantaneously. The FIFO also has a depth, that is, a forward store of consecutive states including therein, the duration of the corresponding state. It is a major function of the processor 96 to write states to the FIFO at such rate to avoid an underflow condition and similarly to avoid a FIFO overflow condition. The FIFO status depends upon the state duration that is specified within the FIFO word and thus remains independent of the activity of processor 96. Such self clocked FIFO buffers are the subject of U.S. Pat. Nos. 4,191,919 and 4,375,676, commonly assigned herewith. The speed limiting aspect of separately addressing each controlled device is therefore eliminated. The buffer 98 must now accommodate a substantially wider buffer word in order to convey to each device, its parameter value(s), but the state duration is directly controlled from the buffer output. A more subtle limitation is imposed on the memory 94. Because all controlled devices are set to desired parameter values, the memory 94 must accommodate the entire definition of each of the successive states of the apparatus. For magnetic resonance systems, the event stream for a measurement may require of the order of $10^8$ words to be written from buffer 98. This word stream passes through memory 94, imposing a significant requirement on memory size and speed. In spite of this memory limitation, prior art of this type represents a speed benchmark.

A further advance in prior art replaces the state machine stuffer 96 with an intelligent processor 97 as shown in FIG. 2c. Data to create the necessary stream of state definitions from stored data, computation or a combination thereof is treated by processor 97 and the fully assembled state description is presented to the FIFO 98. It is important to recognize that processor 97 attends to several functions: unloading of buffered data from the bus, reassembly of the state with possibly required computation (including masking and updating the state where only state changes are transmitted on the bus and saving the now updated state for reference in forming the next state), and managing the output to the FIFO 98 to assure the operation is neither too soon nor too late. The computational load and the data management burden each lead to extreme situations which strain both memory capacity and transfer rate as applied to prior art systems. Exemplary prior art are the NMR instruments manufactured by Chemagnetics under the name "Infinity".

A modern fourier transform NMR instrument executes a complex retinue of instructions affecting the instantaneous RF and magnetic attributes of a sensitive volume within a magnetic field. The sensitive volume may contain a substance examined for analytical study, or an object, the internal volume of which is imaged through exploitation of magnetic resonance phenomena. For example, various measurement techniques commonly require precise control of RF phase, RF pulse shape and RF amplitude and precise cycling of phase over different phase angles as applied to the content of the sensitive volume of the instrument. Many measurement techniques require application of magnetic gradient pulses to the sensitive volume, with similar requirements to phase, shape, direction and amplitude. The gradients may be independent in magnetic component and spatial dependence requiring independent sets of control apparatus. The instantaneous specification of these parameters expresses the output state of the controller. The sequence of states defines the preparation of the magnetic resonance measurement. Acquisition of spectral data represents another instrumental state commencing with precise relative timing.

A realistic specification for the functional requirements of a modern NMR instrument include the precision required for the parameters describing a state, required gating instructions and the relevant time intervals and data rates. Table I summarizes desirable precision for an RF controller and table II represents a similar summary for a vector controller as employed for typical NMR apparatus.

TABLE I

| Parameter | #. bits |
| --- | --- |
| amplitude | 16 |
| phase | 16 |
| attenuator | 8 |
| gates | 8 |
| state duration | 26 |
| multiplexer | 16 |

TABLE II

| Parameter | # bits |
| --- | --- |
| amplitude X | 16 |
| amplitude Y | 16 |
| amplitude Z | 16 |
| state duration | 26 |

It could be observed that an arbitrary controller characterized by extremely fast clocking could satisfy the requirement of aligning instrumental states on a precise time scale. The practical limit for the apparatus is not the limit of what might be achieved, but rather the requirements of the instrumental function. The physical phenomena to be observed (NMR spectra or images) are manifest in the first instance as line widths, chemical shifts, J coupling and the like, typically represented in approximately 5 MHz of bandwidth. MRI conveys spatial distributions with emphasis on spatial resolution and dynamic range, typically consuming 2 to 5 Mhz bandwidth. Assuming a 20 MHz bandwidth requirement, there is suggested a fundamental unit of time alignment for instrumental states of the apparatus of, say, 50 ns. As table I illustrates, the description of a state might require 70 bits. At a fundamental state duration of 50 ns, the system must supply states at the transfer rate of 1400 Mbits/sec. Although contemporary processors operate at such clocking frequencies, it is necessary to observe that the hypothetical 1400 Mbits/sec is a transfer rate. The sequential states of the NMR apparatus must be created (computed or derived from memory) and revised (scaling, phase cycling, vector rotation, etc) and these creation and revision operations are instrumentally and/or computationally intensive with resulting limits on the rate of physical state evolution controlling the apparatus.

A representative contemporary commercially available NMR system is the Varian INOVA® featuring a minimum time resolved state duration of 100 ns. For this system, two synchronized RF modules transfer a total of 60 bits suggesting a transfer rate of about 600 MHz whereas the operational rate for the control processor is 160 MHz. This rate disparity or gap is accommodated by very large buffers (which also present limitations for such use).

Another example of prior art is a waveform controller/synthesizer described in U.S. Pat. No. 4,707,797.

As pointed out above, a progression of many billions of well define instrumental states may be required for NMR measurements of only moderate complexity. In the limit of a large gap between a sustained state evolution rate and the control processor transfer rate, extremely massive buffering becomes economically impractical to narrow that gap. The design philosophy problem may be summarized with the observation that any high speed processor driven instrument system may be regarded as having a finite write rate, $\Omega$, and a finite read (or evolution) rate, $\rho$. For the earliest prior art in an NMR application, the demand upon instrumental process rate was minimal. As the demand for higher resonance frequencies and greater complexity in the prescription of the instantaneous state increased, various schemes were implemented to narrow that excess of the state evolution rate over the rate at which state data is presented to hardware. The creation of the state sequence and formatting of those states to output devices represents a considerable computational burden and measures which reduce that burden are desirable. It should be recognized that in addition to the recognizable computational burden there is a time consuming formatting task necessary to reduce computed parameters to elements of a state descriptor. The excess of the read rate over the write rate may be accommodated by a buffer stage with accompanying requirements that become onerous as the aforesaid gap increases. The RF and vector controllers of the present invention may be viewed as specific measures interspersed between the state sequence generating processor and those output devices to which the state is written. Reduction of the aforesaid rate gap should be recognized as enabling a maximum sustained rate of device instructions processed to approach a maximum (hardware defined) write rate to external devices.

SUMMARY OF THE INVENTION

The controller of the present invention narrows the above described gap in implementing two major strategies. First, the controller architecture retains elements of the state in latched registers that retain their content until rewritten to different content. This reduces the bulk transfer rate burden when the form of the state sequence is reduced to specification of the changes in the contemporaneous state over the preceding state. Second, concurrently with transactions updating other latched registers defining the state description, a computational layer of the controller executes common mathematical operations, specialized for the corresponding fields of the status bits in parallel. These computations are implemented with application specific integrated circuits, executing in parallel within a clock cycle, thereby introducing no rate limiting step(s). Further, this strategy eliminates the need for extensive data packing. As a result, the aforesaid gap is either eliminated, or reduced for manageability through high speed FIFO buffering of modest proportion.

The present invention is directed to a novel controller architecture for control of an NMR instrument wherein the structure allocates certain computational activity within a long sequence of states to occur within a controller possessing both a computational layer and a latched register layer. These layers receive information from a data bus. A latched register retains content unless and until overwritten; thus the prior datum for the corresponding register is preserved if not subject to change. Content of these registers comprise all parameters essential to description of the state including the state duration. Consequently, only changes in status elements, including state duration, need be transmitted on the bus. Certain elements of the state description are derived by computation from parameters of the state description. These operands may or may not exhibit changes between consecutive states. Computational operations are typically addition (for example, adjustment of RF phase), multiplication (such as the scaling of the ordinate of a standard pulse shape) and matrix multiplication (to realize desired rotations of a magnetic gradient vector for NMR measurements). Concurrently active independent RF channels incorporate respective controllers of the invention and magnetic gradient operations are directed through a separate gradient controller.

While the invention is susceptible to various modifications and alternative forms, the above figures are presented by way of example and/or for assistance to understanding the structure or phenomena. It should be understood, however, that the description herein of the specific embodiments is not intended to limit the invention to the particular forms disclosed, but rather, the intention is to cover all modifications, equivalents, and alternatives falling within the spirit and scope of the invention as defined in the appended claims.

DETAILED DESCRIPTION OF THE INVENTION

Figure 1:
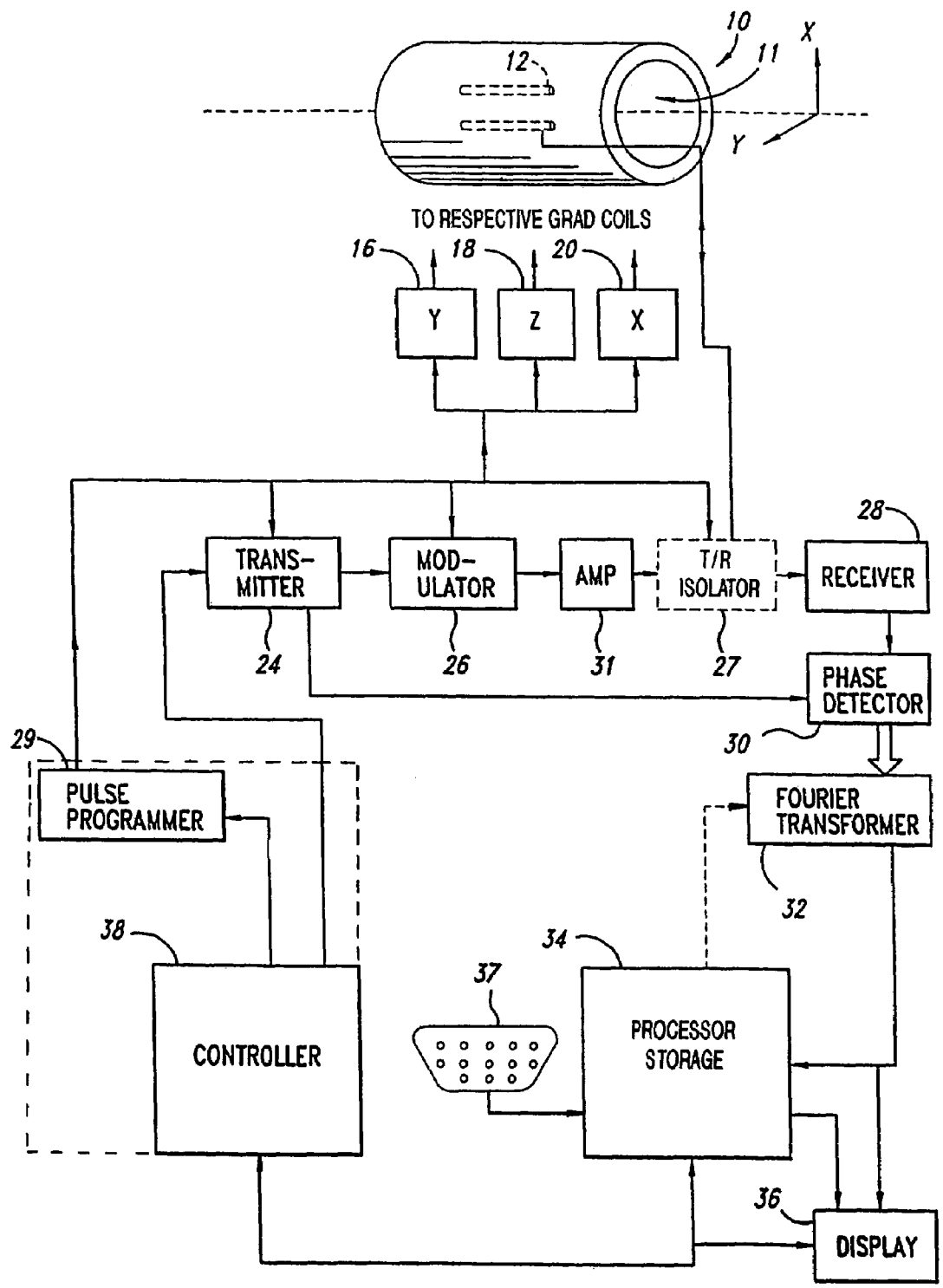
FIG. 1 represents a magnetic resonance apparatus incorporating a controller according to the present invention.
Figure 2A:
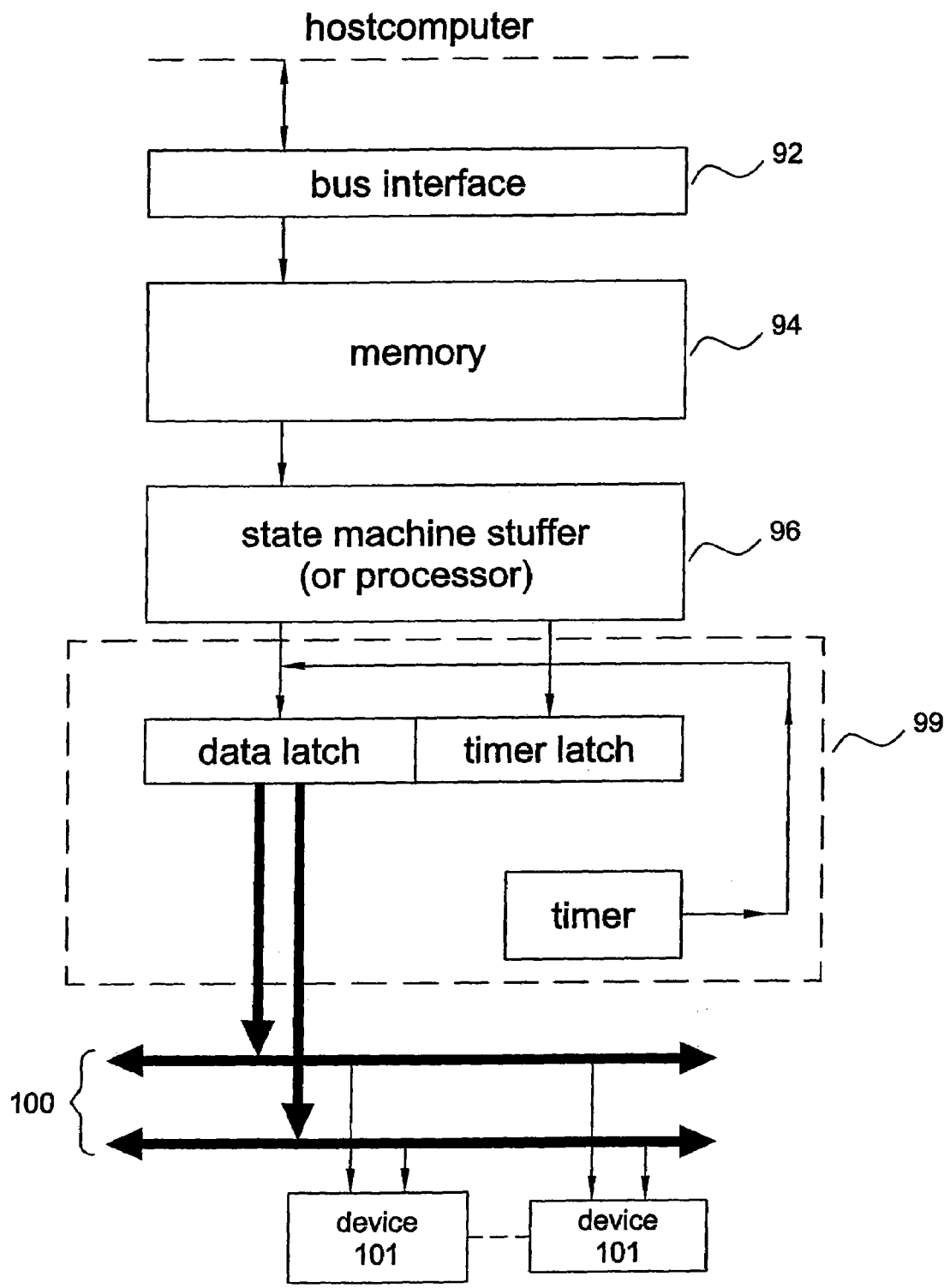
FIG. 2a shows one prior art controller arrangement.
Figure 2B:
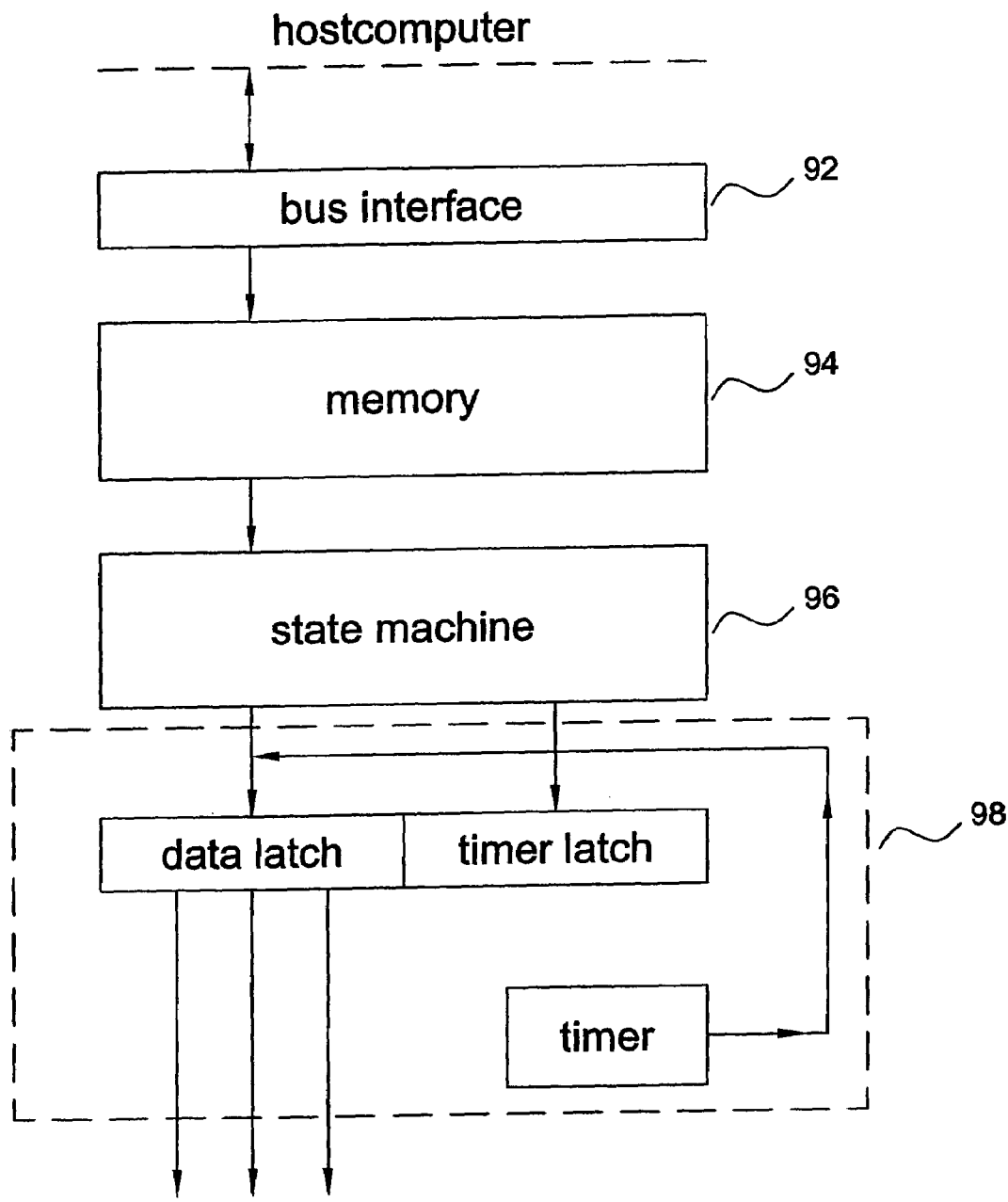
FIG. 2b shows another prior art arrangement.
Figure 2C:
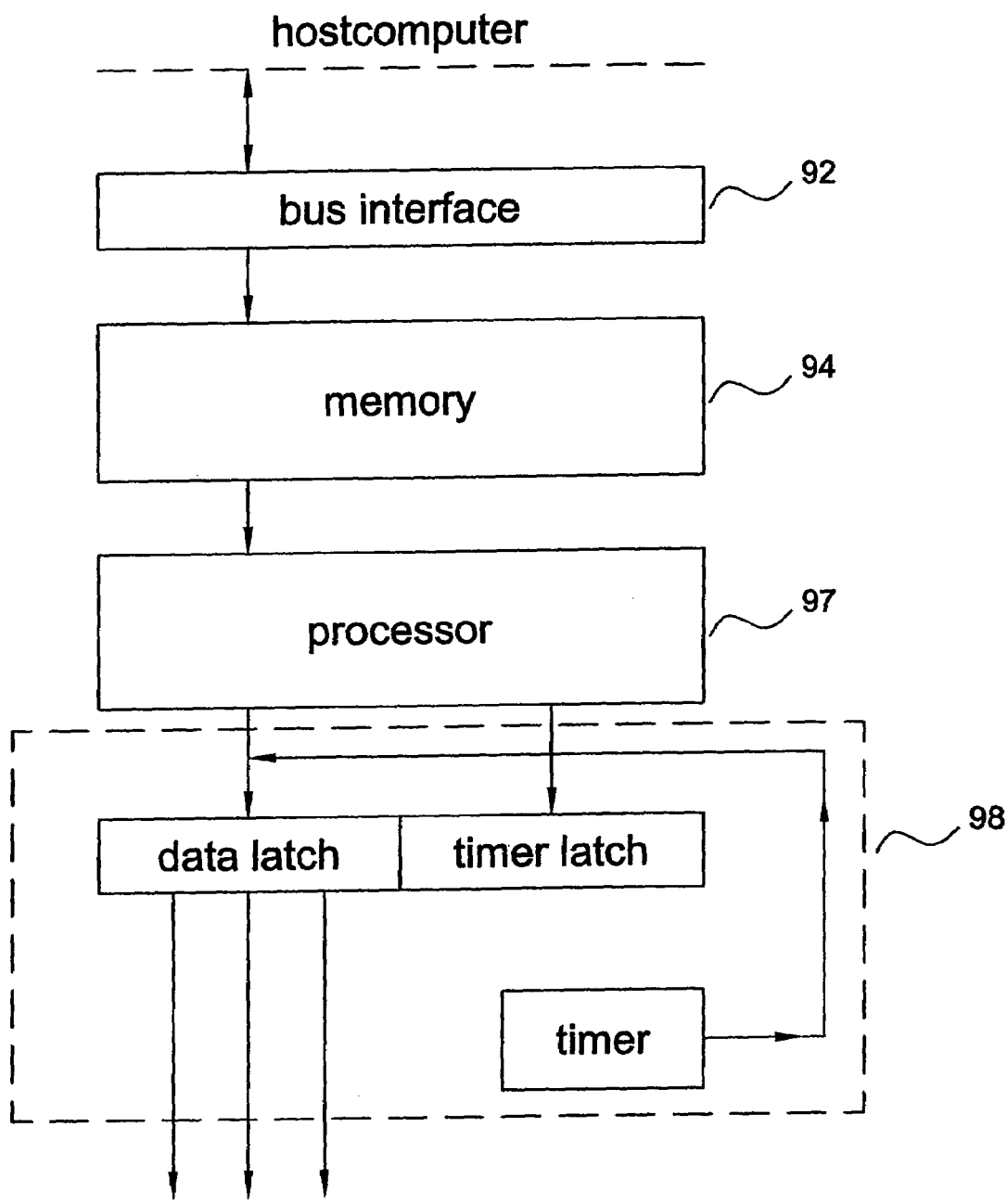
FIG. 2c shows yet another prior art arrangement.

The representative physical context of the invention is an NMR apparatus that includes a number of devices to be controlled in synchrony. An idealized illustration is shown in FIG. 1. A magnet 10 having bore 11 provides a main magnetic field along the axis of the bore. In order to control the magnetic field with precision in time and direction for selected measurements requiring magnetic field gradients, there are provided magnetic field gradient coils (not shown). These are driven by gradient power supplies 16, 18 and 20, respectively. Additionally, other shimming coils (not shown) and power supplies (not shown) may be required for compensating residual undesired spatial inhomogeneity in the basic magnetic field. An object for analysis (hereafter "sample") is placed within the magnetic field in bore 11 and the sample is subject to irradiation by RF power, such that the RF magnetic field is aligned in a desired orthogonal relationship with the magnetic field in the interior of bore 11. This is accomplished through one or more transmitter coil(s) 12 in the interior of bore 11. Resonant signals are induced in a receiver coil, proximate the sample within bore 11. The transmitter and receiver coils may be the identical structure, or separate structures.

As shown in FIG. 1, RF power is provided from first transmitter 24a through modulator 26a, and is amplified by an amplifier 31a and then directed via transmit/receive (T/R) isolator 27 to the probe 12 that includes a first RF transmitter coil 12' located within the bore 11. The transmitter 24a may be modulated in amplitude or frequency or phase or combinations thereof, either upon generation or by a modulator 26a. The conceptual grouping of transmitter 24a, modulator 24a, amplifier 31a, T/R isolator 27 and the receiver is conventionally called the "observe channel". Additional components (transmitter 24b/modulator 26b/amplifier 31b) forming the "decoupler channel") are often employed to independently manipulate different gyromagnetic resonators coupled to the species under investigation, e.g., $^{13}C$ or $^{1}H$. These independent spin manipulations are conveniently supported by multiple coils or a multi-resonant coil. Transmit and receive functions are clearly not concurrently active in the observe channel. The identical observe coil 12 within the probe may be employed for both excitation and acquisition if so desired. Thus, the T/R isolator 27 is provided to separate the receiver from the transmitter 24a. In the case of separate transmitter and receiver coils, element 27 will perform a similar isolation function to control receiver operation.

The modulators 26a,b (or the equivalent) are responsive to controller 38a,b including pulse programmer(s) 29 to provide RF pulses of desired frequency, amplitude, duration and phase relative to the RF carrier at precise pre-selected time intervals for application to corresponding channels. The pulse programmer may have hardware and/or software attributes. The pulse programmer also controls the gradient power supplies 16, 18 and 20, if such gradients are required. These gradient power supplies may impose gradient pulses or maintain selected static gradients in the respective gradient coils if so desired. Each such gradient is specified by gradient amplitude, e.g., $+/- \partial B_z/\partial y$, duration, time of initiation.

The transient nuclear resonance waveform processed by receiver 28 is ordinarily resolved in phase quadrature through phase detector 30. The phase resolved time domain signals from phase detector 30 are presented to Fourier transformer 32 for transformation to the frequency domain in accordance with specific requirements of the processing. Conversion of the analog resonance signal to digital form is commonly carried out on the phase resolved signals through analog to digital converter (ADC) structures which may be regarded as a component of phase detector 30 for convenience.

It is understood that Fourier transformer 32 may, in practice, act upon a stored (in storage unit of processor 34) representation of the phase resolved data. This reflects the common practice of averaging a number of time domain phase resolved waveforms to enhance the signal-to-noise ratio. The transformation function is then applied to the resultant averaged waveform. Display device 36 operates on the acquired data to present the distribution for inspection. In an NMR apparatus, master controller 38, most often comprising one or more digital processors, controls and correlates the time critical operations, such as the performance of pulse sequences in the observe channel, the decoupler channel and the several gradients. Master controller 38 may be regarded as a plurality of distinct functional controllers (RF observe channel, RF decoupler channel and magnetic gradient, for example), each of which ordinarily operates to produce states synchronous with a common time base for maintaining synchrony with resonant spin systems. Overall operation of the entire apparatus within host processor 34 includes input 37 from operating personnel, non-time critical calculation and output for further processing or display.

Figure 3:
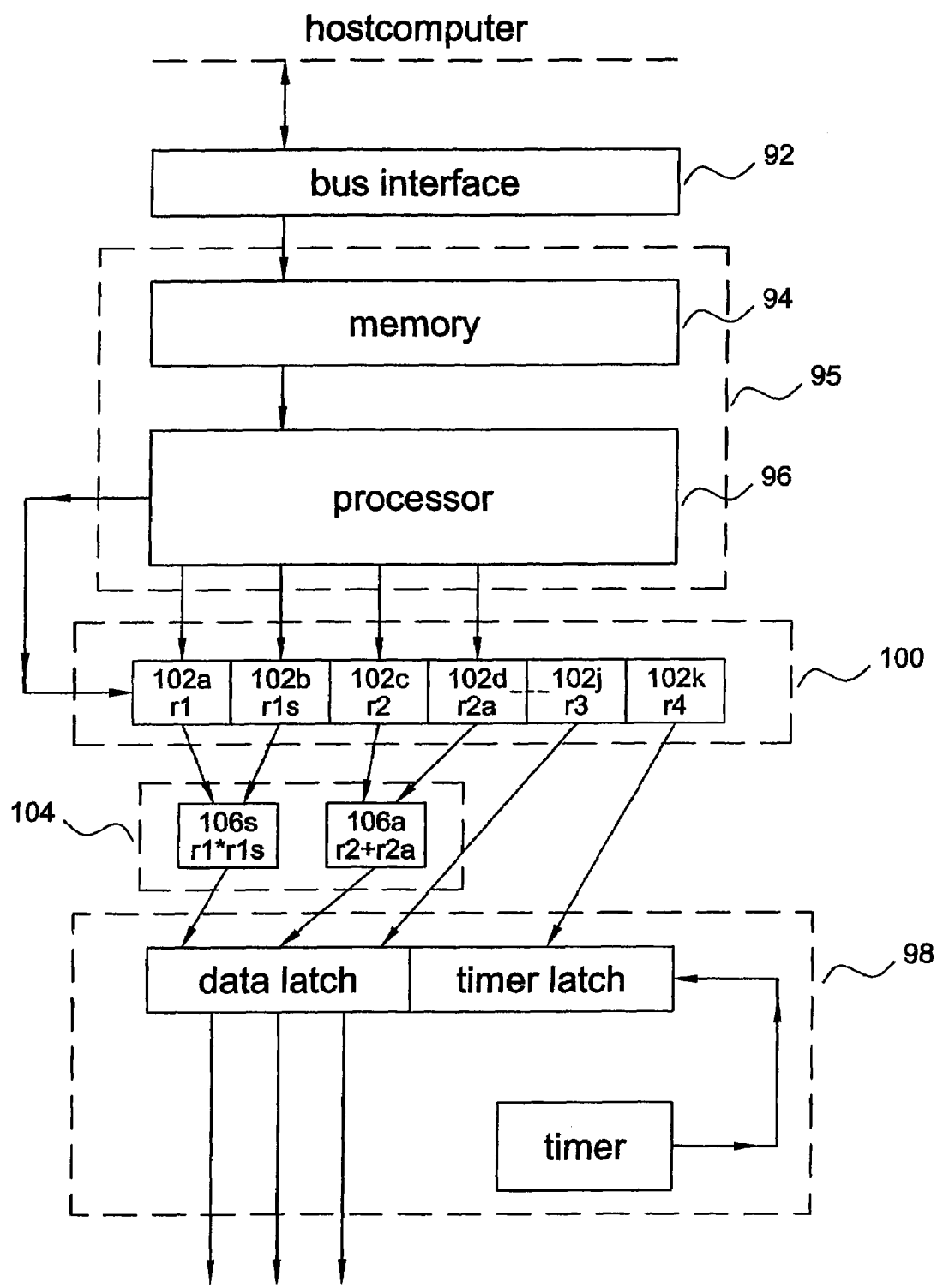
FIG. 3 illustrates a dual level register based controller of the present invention

Turning now to FIG. 3, there is shown a block diagram representative of a preferred embodiment of a controller of the present invention. The central features of the controller are evident in the register layer 100 and the computation/logic layer 104. The register layer comprises a plurality of latched registers 102a, 102b, . . . 102k. Each of these registers retain a digital (or logical) parameter effecting the output state of the controller. The content of each of the latched registers of register layer 100 is retained in the respective register until overwritten by processor 96. The register layer is further distinguished as comprising two species of latched register in accord with the destination of the register content. In the symbolic description of FIG. 3, registers 102i . . . 102k contain values for direct transfer to the asynchronous buffer 98. Registers 102a . . . 102d communicate with corresponding computational cells, such as 106s and 106a representing a computational layer 106. Typical computational operations include scaling (integer multiplication) an instantaneous amplitude to transform a normalized pulse shape to a desired scale; and addition, such as when accumulating phase from phase increments. Computational cells 106s and 106a are realized in known fashion from specialized high speed logic circuits such as field programmable arrays (FPGAs) and such cell includes a latched result register to retain the computed result. Such latched mathematical result register is in correspondence to arguments of the calculation as presented from the relevant latched registers 102a, . . . etc.

Note that the processor 96 exhibits an output rate p to the register layer 100 and the register layer exhibits a certain theoretical maximum write rate $\Omega$ to the asynchronous buffer 98, which may be limited by the presence of a (partially) intervening computational layer 104. Data from non-computational registers 102j, 102k and computational results from cells 106s and 106a are gated to write to the asynchronous buffer 98 by a common signal which is derived from the slowest computation, or alternatively from a logical AND of DATA READY levels available from registers of register layer 104 and computational cells of computational layer 106. Such gating arrangements are well known to practitioners of the art.

Plural RF controllers coexist in some apparatus that require different RF channels that are concurrently active, whether or not these channels are independent. An example of this requirement is found where proton and $C^{13}$ spins are separately and concurrently manipulated, as is common in a wide variety of experiments It has been noted above that it was known practice in prior art to reduce traffic on the system bus by description of the state sequence only through the changes therein to appear in the controlled output. In such prior art architecture the prior state was reconstituted in the controller from a stored image and the changes effected and re-stored and concurrently transferred to the asynchronous buffer. The present invention avoids such operations in the controller processor because the prior state is preserved in the corresponding set of latched registers 102a . . . 102k. In this way, the compression achieved by the state differential sequence description is perfected in the present invention.

The organization of the controller of FIG. 3 reduces the burden on processor 96 to the function of managing the inflow of data (comprising changed parameters of consecutive state pairs) from the bus interface and the outflow of updated state parameters into the asynchronous buffer. This is a time sensitive function because of the need to perform these manipulations within a range of operational speed that is neither too rapid (overrunning the asynchronous buffer 98) nor too slow (allowing underflow of asynchronous buffer 98).

A description of controller operation is a conventional RF controller. Such controller processor accepts the download of the program, which it will execute during the full course of the (NMR) experiment. The controller program to be executed in a particular RF channel contemplates a sequence of pulses of selected shape and frequency content, having specified phase properties, amplitude and pulse width, delays between pulses, and receiver gating. Assume a phase cycling procedure where the phase may be cycled in a selected manner, the length of the interval from receiver gated ON to receiver gated OFF may be set, and the number of repetitions determined. Phase cycling requires a phase increment to be initialized in the phase addend register, for example, and the cycling corresponds to creation of a corresponding looping regime within the controller. The appropriate controller program is composed at the host processor and delivered through the bus interface 92 for initialization by the intrinsic program loading facility of the processor 96. Now consider the present invention: the advantage of latched registers $102_a$ . . . removes the unchanged state variables from any equivalent prior art software loop wherein masking of state descriptor words is carried out with consequent economy for the present invention in both transfer rate, computational burden and the like. Within the core of the interface (between the bus and the FIFO) the computational layer 104 removes computational burden altogether from the processor while executing these operations at a point in time adjacent to FIFO servicing operations.

Figure 4:
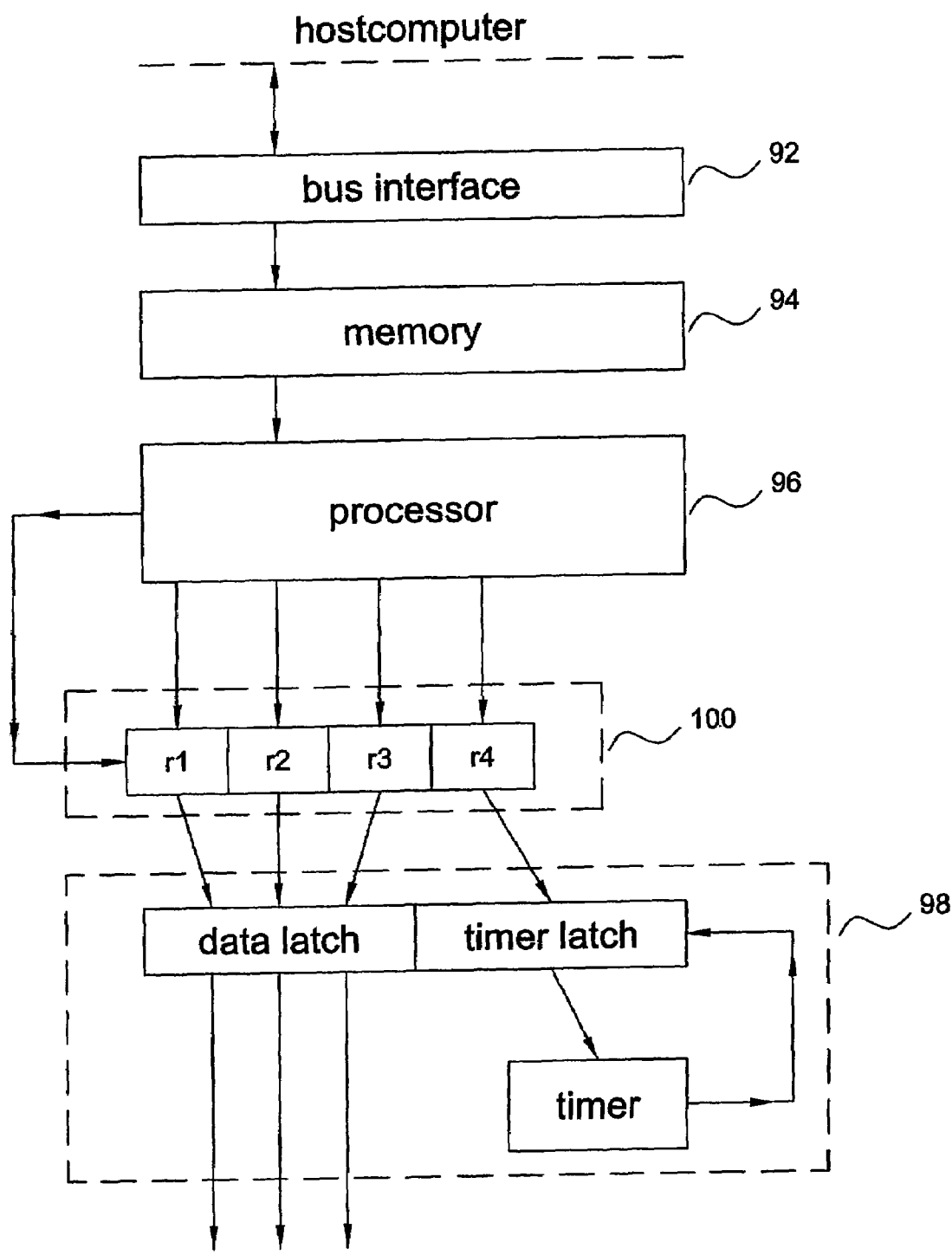
FIG. 4 shows another register based controller of the present invention.

Another embodiment is the simplified controller of FIG. 4. This embodiment differs from the embodiment of FIG. 3 in that there is no mathematical layer and the advantage gained is that of the latched register layer alone. For NMR applications this is not a preferred arrangement inasmuch as computational operations on state variables offers a major advantage in operational efficiency. The advantages of the latched register structure alone are sufficient for a wide range of applications requiring lengthy sequences of synchronous states.

Figure 5:
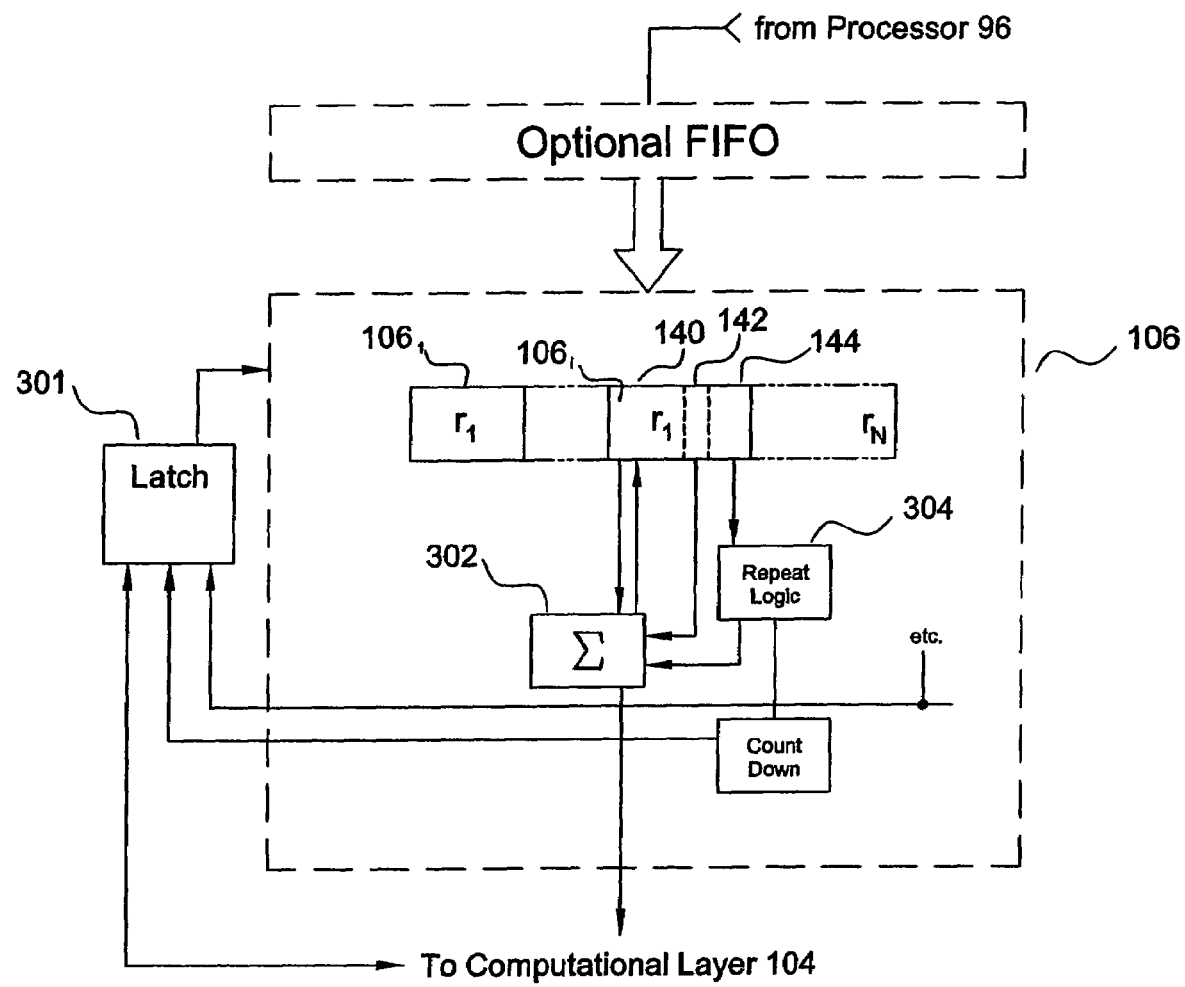
FIG. 5 is another embodiment comprising additional functionality in the register layer.

In another embodiment, an incremental register layer 106 comprises capability for modification of the arguments provided to the computational layer 104 in a prescribed sequential manner from a single datum in the data stream transmitted over the bus 92. It should be readily appreciated that this capability contributes great additional compression in the data stream and thereby further narrows the gap between the achievable write-rate from the host computer and the required read-rate of the various output devices that implement and record the NMR phenomena. FIG. 5 shows a logical schematic of the incremental register layer 106. A representative register 106$_i$' accommodates a subfield 140 corresponding to an argument to be presented to the computational layer 104, another subfield 142 is treated as an increment (decrement) to the argument 140 while the remaining subfield 144 is a repetition count for adjusting the argument. Within layer 106', the argument value 140 and the increment 142 are supplied to adder 302 and the resulting adjusted value argument is restored to the latched register 106$_i$' while also being presented to the computational layer under control of the latch 300. The latch 301 presents the entire register layer 106 to the computational layer 104, together with a data ready gate. This embodiment enables a single instruction to the controller to create a sub-sequence of numerous states in accord with the content of the repetition field 144.

Another application of the inventive controller architecture is also to be found in vector manipulation. Vector control in high speed processes requires control of magnitude (scaling), rotations and time dependence. For magnetic resonance apparatus the manipulation of a magnetic gradient vector underlies many methods of magnetic resonance imaging (and to a lesser extent, certain spectroscopic measurements). For example a 3D image might impose a resultant magnetic gradient vector of different orientations at different times. Components of the gradient vector G are typically $\partial B_z/\partial B_x$, $\partial B_z/\partial B_y$, $\partial B_z/\partial B_z$ and these are furnished by room temperature coil windings where z is the direction of the polarizing field. The alignment of the resultant gradient vector is rotated in correspondence with the functional aspect of gradient formation. One typical class of 3D imaging sequences imposes a slice selection gradient during the RF excitation pulse resulting in excitation of nuclear spins in a selected 2D thickness of the sample forming a plane having a desired orientation. All components may be energized in corresponding magnitudes to yield the desired orientation. Mutually orthogonal phase encoding and readout gradients are similarly energized at requisite times to identify the magnetic resonance response of a pixel or line of the image. The process is repetitive in building the image incrementally by cycling through values of the slice selection, phase encode and readout gradients yielding a free induction decay waveform for each such triplet of gradient directions and intensities. The magnetic gradient resultant is thus subject to a triply cyclic program of discrete rotational increments for such imaging. The mathematical prescription of (3 dimensional) spatial rotation of the resultant gradient is prescribed by a rotation matrix R where R is a 3×3 array and the gradient controller effectuates the rotated vector G' from matrix operators, $$G'=G(R)$$

Vector rotation (and scaling) requires operations for matrix multiplication, as for example $$G'(X, Y, Z) = \begin{pmatrix} R_{11} & R_{12} & R_{13} \\ R_{21} & R_{22} & R_{23} \\ R_{31} & R_{32} & R_{33} \end{pmatrix} \begin{pmatrix} G_X \\ G_Y \\ G_Z \end{pmatrix}$$

Figure 6:
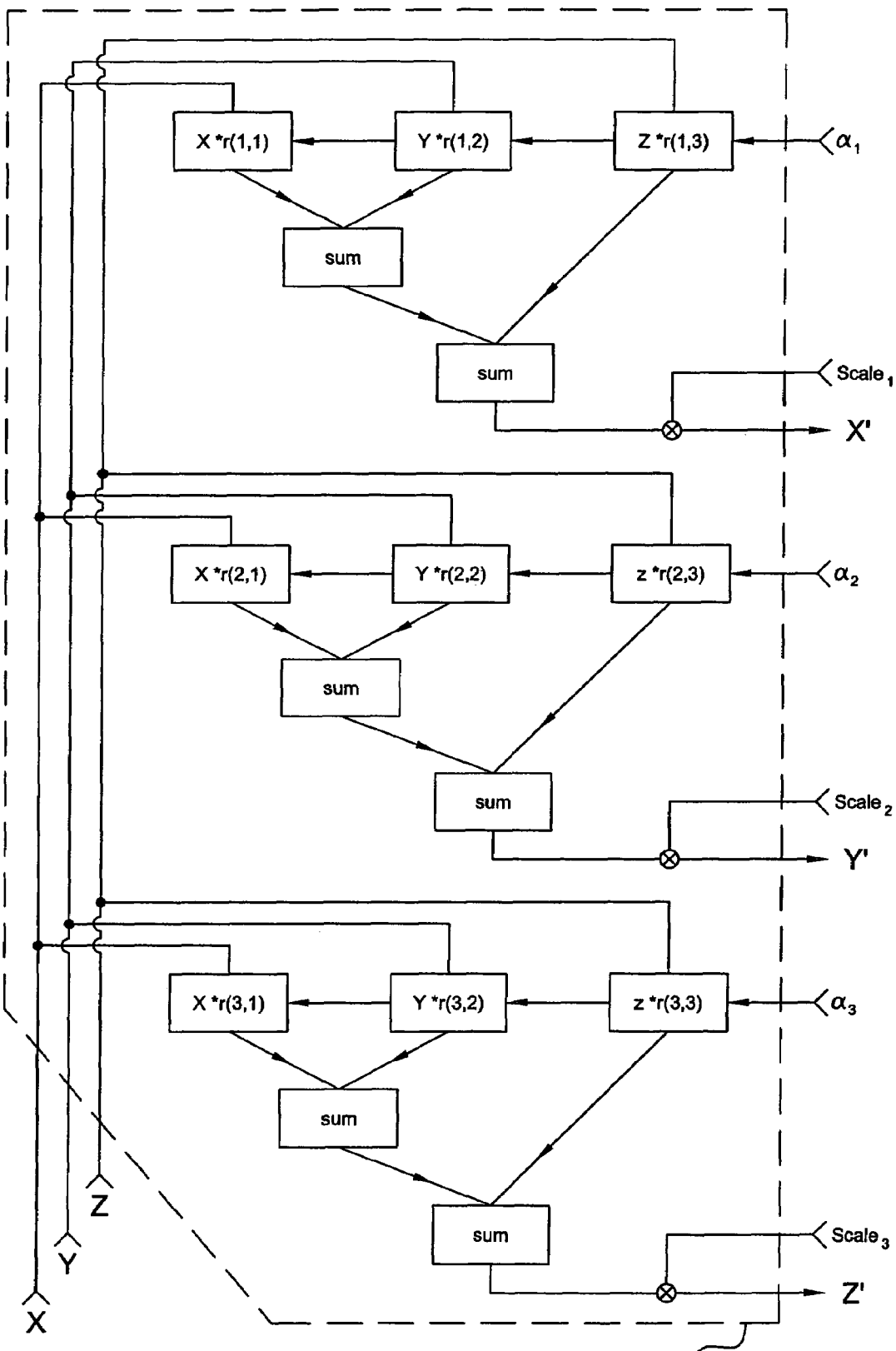
FIG. 6 schematically describes an embodiment of the inventive controller for vector control.

FIG. 6 describes the organization of functional operations required for a computational layer 204 to perform the rotational aspects of the above operations described above. For simplicity, vectors X, Y, and Z may be regarded as the unrotated components of G. The inputs $\alpha_1$, $\alpha_2$, and $\alpha_3$ represent the triads of coefficients for each of the three rows of the rotation matrix. The quantities "Scale$_1$", "Scale$_2$", and "Scale$_3$" are the scaling factors to be applied to each of the three rotated components to establish the vector magnitude. It is clear that each vector component requires four multiplications and two additions to be implemented in a computational layer. FIG. 3 should be regarded as the framework within which FIG. 6 performs the manipulations for vector control through such a computational layer 204 (analogous to computational layer 104 for the RF controller).

The matrix multiplication is carried out in the computational layer 204 from vector components and array elements residing in the latched register layer (analogous to RF controller register layer 102). Recall that not all of these quantities change across state transitions. A gradient vector in three dimensional space, subject to rotations and scaling therefore requires control for each of three gradient basis vectors, all of which must maintain excellent mutual synchrony to produce the desired instantaneous resultant vector.

The guiding architecture for the software/firmware for operating the apparatus is founded on three observations. First, consider the central requirement for the execution of very long sequences of distinct states. Each state is prescribed by a number of parameters and in most applications, the difference between adjacent states is usually to be found in a one or two parameters, perhaps three, rarely more than three. The entire sequence of states is representative as a succession of changes beginning with an initial, or default state. Thus it is only necessary to describe the sequence by the difference of adjacent states including the state durations and such procedure is perfected by retention of state parameters within latched registers of the controller, as above described, in such manner as to obviate reconstituting the entire prior state. A vast economy is achieved in both memory and process steps for establishing each state in this manner.

The major requirement for these controllers is maintenance of precise synchrony. This necessitates both high speed attributes for the hardware driven, efficient data structures and the means for efficiently transforming a state description into a physical state. The controller herein described includes an asynchronous device. More particularly, it incorporates asynchronous-to synchronous conversion, while the self-clocked FIFO structure(s) provide hardware realization of a synchronous train of events from a sequence of prescribed digital states. There remains an intermediate problem in assuring that asynchronous software operations of loading/updating do not overrun/underrun the rate of FIFO output. This task is a greater focus of the controller processor herein by reduction of other computational burden through the computational layer of the controller and reduction in data transfer through retention of unchanging data in latched registers of the controller.

The asymptotic behavior of actual sustained rate performance of any such controller may be appreciated by recognizing that there is a hardware defined maximum rate for accepting input datums by the FIFO. Assume a FIFO accommodating a sequence of L states and that this maximum FIFO read rate is identical to the maximum FIFO output or write rate. If state descriptors are supplied to such a FIFO of depth L states, at the maximum FIFO read rate, a synchronous state description is achieved at the FIFO input and the sustained rate equals the maximum FIFO read rate for an indefinite number of n*L states. As a practical matter, the act of supplying the state descriptor includes the essential computations, data transfer and controller operations discussed herein (and separately, the FIFO clocks out individual states for significant durations). For purposes of discussion, assume the processing of an individual state requires an additional unit $\lambda$ of clock time (on the average) for each set of L states, the system and controller "above" the FIFO falls behind the FIFO read rate (which we may regard as a characteristic maximum rate) by an incremental amount, or rate gap. However on these suppositions the theoretical maximum number of states accommodated in sustained synchronicity simply becomes L (L-$\lambda$). The present invention serves to reduce the number of operations required above the FIFO, with the result that the construct designated $\lambda$ is greatly reduced as is the gap between sustained (asynchronous) rate of states presented to the FIFO and the maximum hardware defined state acceptance rate, for a given length state sequence. An alternative view of this is to consider the average duration $T_d$ per state in a very long sequence and an average processing time per state $T_p$ (including all relevant computation, data transfer and controller processes). It may be shown that the number of states N accommodated before underflow of the FIFO is $$N=L(1+T_p/(T_p-T_d))$$

As the time gap $T_p-T_d$ is reduced (a goal of this invention), the quantity N/L increases and increased FIFO depth becomes a less stringent requirement for preservation of long synchronous state sequences.

One will appreciate that quantitative evaluation of hardware built according to the invention depends significantly upon the nature of the state variations forming the sequence. It has been observed that for relatively simple NMR state sequences involving phase and scale manipulations, an RF controller following the present invention has been observed to support a factor of two increase in sustained rate of state sequence presentation compared to prior art. The (vector) magnetic gradient controller exhibits capability for an order of magnitude increase in such sustained rate over prior art for comparable state sequences.

Although this invention has been described with reference to particular embodiments and examples, other modifications and variations will occur to those skilled in the art in view of the above teachings. It should be understood that, within the scope of the appended claims, this invention may be practiced otherwise than as specifically described.

What is claimed is:

1. A controller for producing a sequence of states derived from an input bus, each said state comprising a plurality of independent variables realized as digital values, each said variable expressed in a corresponding digital precision and said state further characterized by duration, said controller comprising,
   (a) a plurality of latched registers for receiving and retaining corresponding datums from said input bus,
   (b) at least one latched mathematical register assembly for receiving and retaining corresponding datums from said input bus, said latched mathematical register assembly comprising a computational module for combining said datums in accord with a mathematical rule to yield a computed result datum, and a corresponding latched result register to retain said computed result datum, and
   (c) a plurality of FIFO portions, each portion in correspondence with one said latched register and latched result register, each said latched register and result register in corresponding relationship with one said FIFO portion, whereby a FIFO assembly comprising said FIFO portions contains a sequence of said states.

2. The controller of claim 1, wherein said FIFO assembly comprises an output register and wherein a duration interval is derived from each said state, each said state persisting in said output register for said duration interval.

3. The controller of claim 1, wherein said state comprises a vector field.

4. The controller of claim 3, wherein said vector is a magnetic gradient.

5. The controller of claim 3, wherein said vector is a magnetic gradient.

6. The controller of claim 1, wherein said state comprises an RF field.

7. The controller of claim 1, wherein said state comprises a vector field.

8. The controller of claim 1, wherein said state comprises an RF field.

9. A controller for producing a sequence of states derived from an input bus, each said state comprising a plurality of independent variables realized as digital values, each said variable expressed in a corresponding digital precision and said state further characterized by duration, said controller comprising,
   (a) a plurality of latched registers for receiving and retaining corresponding datums from said input bus and wherein at least one said latched register comprises an argument portion of said datum, an increment portion of said datum and an adder for modifying said argument through addition of said increment portion and communication of the result thereof both to a corresponding mathematical register and to replace the value held in said argument portion of said at least one latched register,
   (b) at least one latched mathematical register array for receiving and retaining corresponding datums from said corresponding latched register, said latched mathematical register array comprising a computational module for combining said datums in accord with a mathematical rule to yield a computed result datum, and the corresponding latched mathematical register adapted to retain said computed result datum, and (c) a plurality of FIFO portions, each portion in correspondence with one said latched register and latched mathematical register, each said latched register and latched mathematical register in corresponding relationship with one said FIFO portion, whereby a FIFO assembly comprising said FIFO portions contains a sequence of said states.

10. The controller of claim 9, said FIFO assembly comprises an output register and wherein a duration interval is derived from each said state, each said state persisting in said output register for said duration interval.

11. A method of controlling a system instantaneously specified by a plurality of parameters, said system including a clock device for synchronous operation, comprising the steps of:
   initializing said plurality of parameters for defining each said state to default values thereof,
   prescribing a progression of states at subsequent adjacent discrete times, comprising
   assigning a duration to each state,
   characterizing each state by the changes in value from the preceding state of one or more said parameters,
   transfering only said changed values to a corresponding plurality of latched data registers, said latched registers corresponding to operand parameters, and also transferring content of said latched registers to a respective computational cell and computing the resultant of said operand parameters and retaining same in a latched resultant register,
   communicating the parameters retained from each said latched register and each said resultant register and corresponding duration to an asynchronous-to-synchronous buffer,
   presenting said parameters and resultants to an output in synchronous relation to said clocking device, and
   maintaining said output for said corresponding duration.

12. The method of controlling the system of claim 11, wherein said operand parameters transferred to said latched registers comprise, at least, values proportional to RF phase, RF amplitude, and RF frequency.

13. The method of controlling the system of claim 11, wherein said operand parameters transferred to said latched registers comprise, at least, magnetic gradient vector magnitude and magnetic gradient vector orientation.

14. A controller for producing a sequence of states derived from an input bus, each said state comprising a plurality of independent variables realized as digital values, each said variable expressed in a corresponding digital precision and said state further characterized by duration, said controller comprising:
   a plurality of latched registers for receiving and retaining corresponding datums from said input bus, said latched registers communicating with a plurality of FIFO portions said portions including a state duration, each portion in correspondence with one said latched register, each said latched register in corresponding relationship with one said FIFO portion, and state persistence logic whereby each said state is produced at an output of said FIFO for a specified duration.
   an incremental state generator wherein at least one said latched resister comprises an argument portion of said datum, an increment portion of said datum and an adder for modifying said argument through addition of said increment portion and communicates the result thereof both to a corresponding said latched register and to re-place the value held in said argument portion of said latched register.

15. The controller of claim 14, wherein selected said FIFO portions communicate with a source of RF power and control one or all of the RF phase, RF amplitude and RF frequency.

* * * * *